United States Patent
Kawano

(10) Patent No.: US 7,405,472 B2
(45) Date of Patent: Jul. 29, 2008

(54) SEMICONDUCTOR DEVICE

(75) Inventor: Masaya Kawano, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/762,793

(22) Filed: Jun. 14, 2007

(65) Prior Publication Data
US 2007/0235885 A1 Oct. 11, 2007

Related U.S. Application Data

(62) Division of application No. 11/083,983, filed on Mar. 21, 2005, now Pat. No. 7,247,935.

(30) Foreign Application Priority Data

Mar. 19, 2004 (JP) ............................. 2004-081743

(51) Int. Cl.
H01L 23/02 (2006.01)
(52) U.S. Cl. ................ 257/686; 257/692; 257/E25.013
(58) Field of Classification Search ....................... None
See application file for complete search history.

(56) References Cited

U.S. PATENT DOCUMENTS 6,335,491 B1 1/2002 Alagaratnam et al.
6,400,008 B1 6/2002 Farnworth
6,469,370 B1 10/2002 Kawahara et al.
6,671,947 B2 1/2004 Bohr
2002/0036340 A1 3/2002 Matsuo et al.
2002/0074637 A1 6/2002 Mcfarland
2002/0079567 A1 6/2002 Lo et al.
2003/0127720 A1 7/2003 Fang

FOREIGN PATENT DOCUMENTS

JP 2000-012618 1/2000

Primary Examiner—Evan Pert
Assistant Examiner—Ben P Sandvik
(74) Attorney, Agent, or Firm—Young & Thompson

(57) ABSTRACT

A semiconductor device, which is constituted in such a way that a pad portion of a logic chip is connected to an element region of a semiconductor chip with a bump bonding, is capable of achieving high speed operability of the elements, because delay of transmission of an electrical signal is suppressed. a logic chip is directly connected to a DRAM, therefore, it is possible to suppress an increase of load capacitance caused by interconnects, and securing a wide bus width by a multiple pin connection. As a result, it becomes possible to enhance performance of the semiconductor device upon suppressing delay of information transmission from the logic chip to the DRAM.

2 Claims, 5 Drawing Sheets

SEMICONDUCTOR DEVICE

This application is based on Japanese patent application NO. 2004-081743, the content of which is incorporated hereinto by reference.

BACKGROUND OF THE INVENTION

1. Field of the Invention

The present invention related to a semiconductor device formed with layered semiconductor chips.

2. Related Art

In recent years a semiconductor device is required to be lightweight, thin, and short sized, and a high performance. In the semiconductor device such as a multi-chip package or the like, realizing high density interconnect, miniaturization of a logic chip and capacity increase of a memory is aggressively promoted.

As one corresponding medium coping with such requirements, it is tried that realizing high density interconnect or the like is achieved upon providing a through electrode on the semiconductor substrate. The Japanese Laid-Open Patent Publication No. 2000-12618 discloses this kind of technology. As shown in FIG. 10, the Japanese Laid-Open Patent Publication No. 2000-12618 discloses the technology connecting a package substrate 17 with a buffer circuit via a terminal 16 and a terminal 18 while using an electrode 15 penetrating through a semiconductor substrate 12 from a rear surface of the semiconductor substrate 12, on which the buffer circuit that is connected to the semiconductor substrate 11 via a terminal 13 and a terminal 14 is integrated.

SUMMARY OF THE INVENTION

In a package where layered system chips are formed, it is preferred to join elements via a bump not a wire bonding. To join the elements via the bump improves high speed operability of the elements. In particular, in a package including the elements such as logic chips, which are required to operate in high speed, it is desired to connect directly between elements by a bump bonding. In addition, in recent years, there is a tendency that the size of the logic chips becomes smaller, whereas the capacity of the memory elements are increased and the size thereof are increased. For this reason, in a layered structure where a small logic chip and a memory element, which has larger size than that of the logic chip, are formed in this order, an input/output of the logic chip can not be introduced to the outside using a wire bonding or the like. Consequently, in a configuration performing the bump bonding between the logic chip and the other element, it becomes necessary to provide a through electrode connecting a rear surface side of the substrate with a front surface side of the substrate.

However, it has now been discovered that the through electrode of a configuration described in the related art is formed across the front surface from a rear surface of an element, therefore, there is a problem that an effective use area of the element is reduced. That is, it is not possible to provide an interconnect or the like in the region where the through electrode is formed, therefore, the effective use area of the element is reduced, so that an integration density of the interconnect or the like deteriorates. In the case of the logic chip that is intensely required to realize high density interconnect, the above mentioned problem becomes more serious.

According to the present invention, a semiconductor device comprising: a first semiconductor chip with a first pad on a main face of the first semiconductor chip, a second semiconductor chip as a logic chip, the second semiconductor chip having a semiconductor substrate, a multi-level interconnect layer provided on a front surface of the semiconductor substrate, a through electrode, which penetrates the semiconductor substrate, being connected to a conductive component provided within the multi-level interconnect layer and a second pad mounted on a top of the multi-level interconnect layer, wherein the first semiconductor chip and second semiconductor chip are flip-chip connected with each other via the first pad and the second pad.

According to the present invention, the second semiconductor chip is connected to the first semiconductor chip via the first pad and the second pad, and there is adopted a configuration of providing a through electrode in a logic chip to achieve high speed operability of the element. On the other hand, there is adopted a configuration where the through electrode is connected to a conductive component provided within a multi-level interconnect layer, therefore, it becomes possible to effectively utilize an upper region of the through electrode, so that it is possible to improve an interconnect density as compared with the related art.

According to the present invention, a pad portion of the second semiconductor chip is connected to an element region of a first semiconductor chip via the first pad and the second pad, therefore it is possible to achieve high speed operability of the element because delay of transmission of an electrical signal is suppressed.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
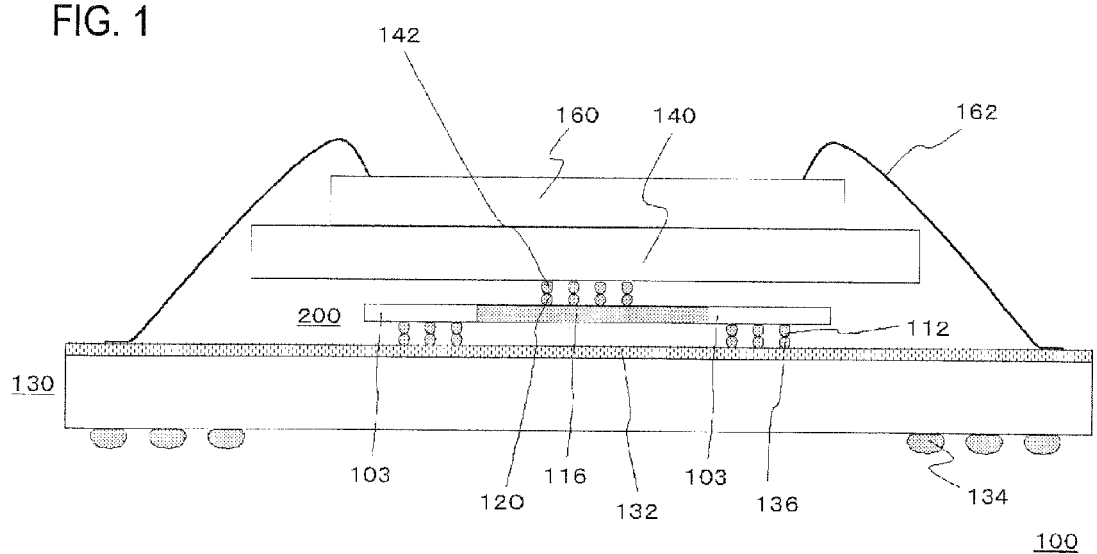
FIG. 1 is a cross-sectional view for explaining a structure of a semiconductor device according to an embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Hereinafter, there will be described an embodiment of the present invention while referring to the drawings. In the whole drawings, the same symbol is attached to the same component, and detailed description will be omitted appropriately in the following explanation.

A semiconductor device shown in FIG. 1 has a first semiconductor chip (DRAM 140) with a first pad (bump 142) on a main face of the DRAM 140 and a second semiconductor chip (logic chip 200).

In the present invention, the second semiconductor chip may have a buffer unit having an input buffer circuit and an output buffer circuit, and the conductive component may be provided in the buffer unit, while the second semiconductor chip may have a converter circuit unit having an input voltage converter circuit and an output voltage converter circuit, and the conductive component may be provided in the converter circuit unit.

In the present invention, the first semiconductor chip may be a memory, and further the memory may be a DRAM or a flash memory.

First Embodiment

FIG. 1 is a cross-sectional view showing a configuration of a semiconductor package 100 according to the present embodiment.

The semiconductor package 100 is composed of a package substrate 130 as a circuit substrate, the logic chip 200, the DRAM 140, and a flash memory 160. Here, the front surface of the package substrate 130 is provided with an interconnect layer 132, and the rear surface of the package substrate 130 is provided with a bump 134. In addition, the interconnect layer 132 provided for the package substrate 130 is electrically connected to the logic chip 200 via the through electrode 110 or the like, which is described later. The logic chip 200 is electrically connected to the DRAM 140 via the bump 120 and a bump 142. Here, the bump 120 is mounted on the top of a logic circuit 116, which is described later. The flash memory 160 is mounted on the DRAM 140, and the flash memory 160 is electrically connected to the interconnect layer 132 provided for the package substrate 130 via a gold wire 162 or the like.

Figure 2:
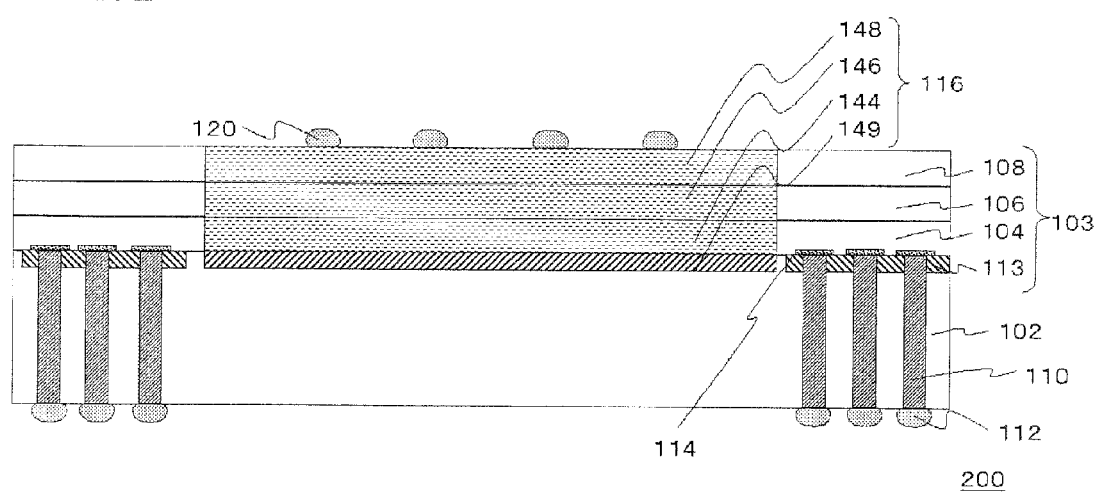
FIG. 2 is a cross-sectional view for explaining a structure of the semiconductor device according to the embodiment.

FIG. 2 shows a detailed configuration of the logic chip 200.

The logic chip 200 is composed of the substrate 102, the through electrode 110, the logic circuit 116, and a converter circuit 103 which converts voltage and/or current of an input signal and/or an output signal. In the present embodiment, the substrate 102 is a silicon substrate. In addition, the logic circuit 116 is composed of an element layer for a logic circuit 149 constituted such that transistor or the like is formed on the front surface of the substrate 102, and a first interconnect layer 144, a second interconnect layer 146 and a third interconnect layer 148 formed on the substrate 102. The converter circuit 103 is composed of the element layer for an converter circuit 113 constituted such that the transistor or the like is formed on the front surface of the substrate 102, and a first interconnect layer 104, a second interconnect layer 106 and a third interconnect layer 108 formed on the substrate 102. Here, the converter circuit 103 has a function converting a voltage level and a current level of an electrical signal input from the interconnect layer 132 provided on the semiconductor package 100 to output to the logic circuit 116, and a function converting a voltage level and current level of an electrical signal input from the logic circuit 116 to output to the interconnect layer 132.

The through electrode 110 is electrically connected to a bump 136 provided on the front surface of the interconnect layer 132 of the package substrate 130 via the bump 112 provided on the rear surface of the substrate 102. In addition, the through electrode 110 is electrically connected to an interconnect 114 in the first interconnect layer 104 while penetrating the substrate 102. In the present embodiment, the first interconnect layer 104 is formed directly just above the element layer for logic circuit 149.

Here, there are various methods as for the method to connect the through electrode 110 to the interconnect 114. Hereinafter, one example thereof will be shown.

First, a hole, which penetrates the substrate 102 to the interconnect 114 in the first interconnect layer 104, is formed in such a way as to perform etching the substrate 102 from the rear surface side thereof. Next, an insulating film is formed on a sidewall of the hole formed on the substrate 102. Subsequently, the hole is filled up with a metal with high conductivity such as copper, aluminum, nickel or the like, while plating the metal. In such a way as above, the through electrode 110 is formed. Next, the bump 112 is provided, upon plating the metal with high conductivity such as copper, aluminum, nickel or the like, and gold on the rear surface side of the substrate 102 of the through electrode 110. According to the above, the through electrode 110 is connected to the interconnect 114.

Hereinafter, there will be described effects caused by the fact that the semiconductor package 100 is provided with the above described configuration in the present embodiment.

In the present embodiment, the through electrode 110 is not electrically connected to the third interconnect layer 108 but electrically connected to the first interconnect layer 104 residing on a lower layer. Consequently, it is possible to utilize the region providing the through electrode 110 effectively in that the interconnect or the like is capable of being formed on the region of an upper portion than the first interconnect layer 104. In the through electrode of a configuration where the through electrode penetrates through the top of the interconnect layer, it is not possible to form the interconnect or the like on such region, on the contrary, in the configuration of the present embodiment, a space use efficiency is improved in this point.

Furthermore, the interconnect layer 132 is electrically connected to the logic chip 200 because the through electrode 110, the bump 112 provided on the rear surface of the substrate 102 of the logic chip 200 and the bump 136 provided on the front surface of the interconnect layer 132 of the package substrate 130 are electrically connected to one another directly. In the logic chip of a configuration providing a connection terminal at an outer periphery, by miniaturizing the semiconductor package, it is difficult to secure a space to mount the connection terminal, on the contrary, in the constitution of the present embodiment, the number of the connection terminal to connect to the package substrate 130 is capable of being secured sufficiently. Consequently, it is possible to fine the logic chip, so that it is possible to miniaturize the semiconductor package 100.

In addition, when manufacturing the logic chip 200 or the DRAM 140, a wafer process is used, therefore, when forming the through electrode on these elements, the through electrode is formed on the wafer. Here, when an area of the wafer on which the element is mounted is the same, a cost per one wafer on which the through electrode is formed is the same. For this reason, it is possible to suppress increase of a manufacturing cost per one chip when forming the through electrode, upon selecting a method in which large number of chips is capable of being manufactured from one wafer as compared with a method in which less number of chips is manufactured from one chip. Consequently, it is possible to suppress increase of the manufacturing cost per one chip, upon providing the through electrode 110 on the small sized logic chip 200 among the semiconductor chips, which constitute the semiconductor package 100, as compared to the case where the through electrode is provided on the larger sized chip than the logic chip 200, such as for instance, the DRAM 140 or the like. As a result, it is possible to improve the space use efficiency in each interconnect layer in the converter circuit 103 of the logic chip 200 while suppressing the increase of the cost to manufacture the semiconductor package 100.

A circuit face of the logic chip 200 is provided on the upper surface thereof; and a circuit face (main face) of the DRAM 140 is provided on the lower surface thereof. Here, an electrical connection between the logic chip 200 and the DRAM 140 is achieved in such a way that the bump 120 provided on the circuit face side of the logic chip 200 is faced to the bump 142 provided on the circuit face (main surface) side of the DRAM 140, followed by electrically connecting directly to each other. Consequently, it is possible to suppress increase of a load capacitance generated by an electrical connection between the logic chip 200 and the DRAM 140, upon providing an interconnect connecting the logic chip 200 to the DRAM 140. In addition, since the number of access of an electrical signal is capable of being increased greatly with a multiple pin connection, it is possible to increase greatly the amount of transmittable information from the logic chip 200 to the DRAM 140, so that it becomes possible to secure a wide bus width. As a result, it becomes possible to suppress delay of transmission of the electrical signal from the logic chip 200 to the DRAM 140, so that it is possible to operate the element in high speed operation.

Second Embodiment

In the first embodiment, a configuration is that the interconnect layer 132 provided on the package substrate 130 is electrically connected to the logic chip 200 via the bump 136 and the bump 112, however, an interposer 150 may be provided between the package substrate 130 and the logic chip 200.

Figure 3:
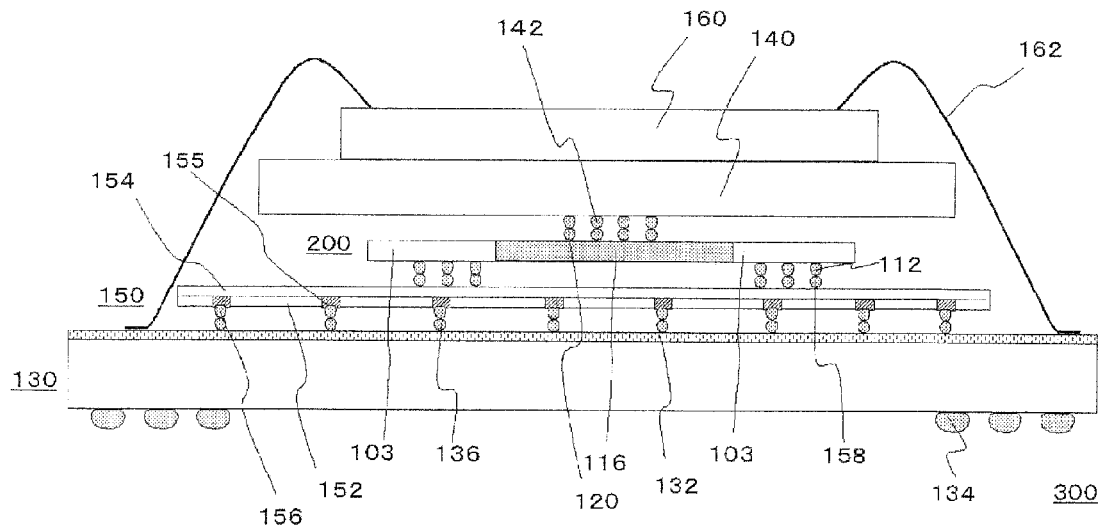
FIG. 3 is a cross-sectional view for explaining a structure of the semiconductor device according to the embodiment.

FIG. 3 is a cross-sectional view showing a configuration of a semiconductor package 300 according to the present embodiment.

The interconnect layer 132 provided on the package substrate 130 is electrically connected to the interposer 150 via the bump 136 provided on the front surface of the interconnect layer 132 and a bump 156 provided on a rear surface of a substrate 152 of the interposer 150. In addition, a through electrode 155 penetrates the substrate 152 of the interposer 150, and is electrically connected to an interconnect layer 154 of the interposer 150.

The interposer 150 is electrically connected to the logic chip 200 via a bump 158 provided on the front surface of the interconnect layer 154 of the interposer 150 and the bump 112 provided on the rear surface of the substrate 102 of the logic chip 200 shown in FIG. 2 with the detailed configuration.

Hereinafter, there will be described effects of the semiconductor package 300.

In some cases, pitch of the bump 112 provided on the rear surface of the substrate 102 of the logic chip 200 is minimized caused by size reduction of the logic chip 200, when minimizing the pitch of the bump 136 mounted on the front surface of the interconnect layer 132 provided on the package substrate 130 corresponding to the pitch of the bump 112, the cost of the package substrate increases.

On the other hand, in the present embodiment, the logic chip 200 is connected to the package substrate 130 via the interposer 150. For this reason, the pitch of the bump 136 mounted on the front surface of the interconnect layer 132 provided on the package substrate 130 does not correspond to the pitch of the bump 112 mounted on the rear surface of the substrate 102 of the logic chip 200 but may correspond to the pitch of the bump 156 mounted on the rear surface of the substrate 152 of the interposer 150. Consequently, it may be suitable that the pitch of the bump 136 mounted on the front surface of the interconnect layer 132 provided on the package substrate 130 is not minimized, accompanied with the size reduction of the logic chip 200. As a result, in addition to the effect of the first embodiment, the space use efficiency is capable of being improved in the respective interconnect layer within the converter circuit 103 of the logic chip 200 while suppressing the increase of cost of the package substrate 130.

Figure 4:
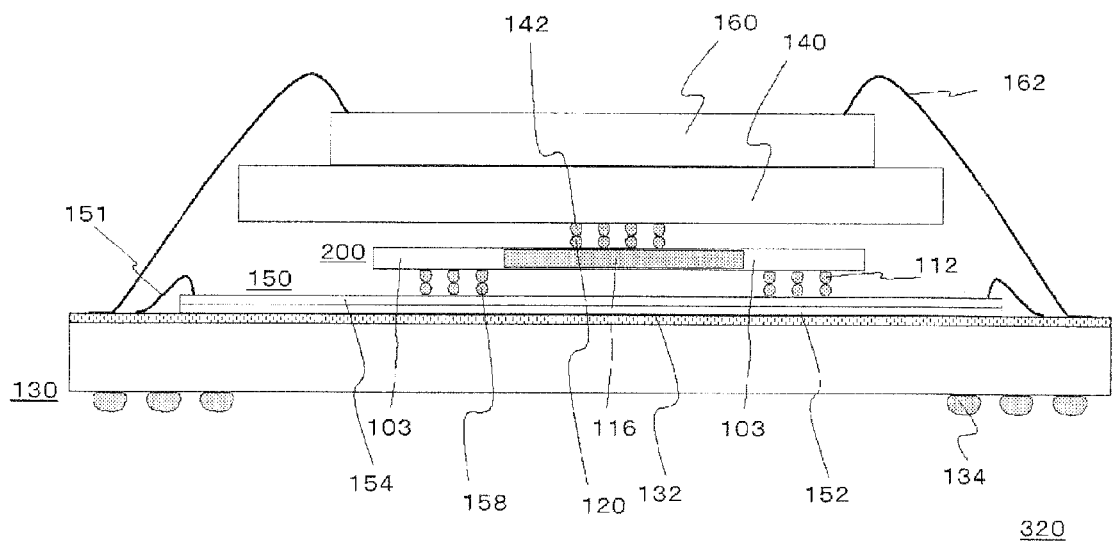
FIG. 4 is a cross-sectional view for explaining a structure of the semiconductor device according to the embodiment.

As a semiconductor package 320 shown in FIG. 4, the front surface of the interconnect layer 132 provided on the package substrate 130 may be directly bonded with the rear surface of the substrate 152, and the front surface of the interconnect layer 132 provided on the package substrate 130 may be electrically connected to the front surface of the interconnect layer 154 of the interposer 150 with a gold wire 151 or the like.

Third Embodiment

In the first embodiment and the second embodiment, the configuration is that the DRAM 140 is mounted on the logic chip 200, however, a configuration may also be suitable that the DRAM 140 is mounted on the package substrate 130 and the logic chip 200 is mounted on the DRAM 140.

Figure 5:
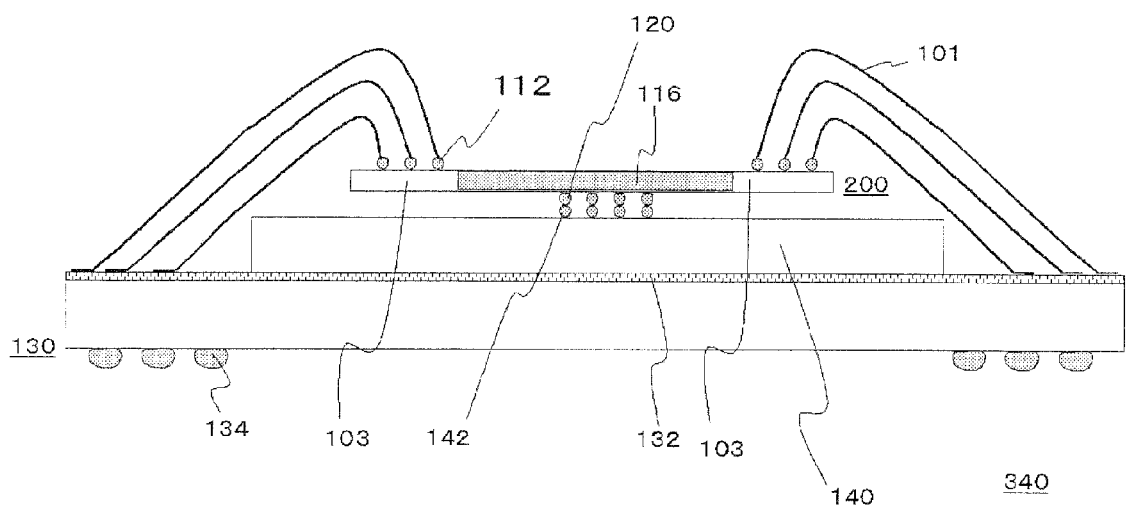
FIG. 5 is a cross-sectional view for explaining a structure of the semiconductor device according to the embodiment.

FIG. 5 is a cross-sectional view showing a configuration of a semiconductor package 340 according to the present embodiment.

The DRAM 140 is mounted on the package substrate 130, the logic chip 200 is mounted on the DRAM 140, and the bump 112 mounted on the rear surface of the logic chip 200 is electrically connected to the interconnect layer 132 provided on the package substrate 130 with the gold wire 101.

Hereinafter, there will be described effects of the semiconductor package 340.

A circuit face (main surface) of the DRAM 140 is provided on the upper surface thereof; and a circuit face of the logic chip 200 is provided on the lower surface thereof. Therefore, an electrical connection between the logic chip 200 and the DRAM 140 is achieved in such a way that the bump 120 provided on the circuit face side of the logic chip 200 is faced to the bump 142 provided on the circuit face (main surface) side of the DRAM 140, followed by connecting directly to each other. Consequently, it is possible to suppress an increase of a load capacitance generated by an electrical connection between the logic chip 200 and the DRAM 140, upon providing an interconnect connecting the logic chip 200 to the DRAM 140. In addition, since the number of access of an electrical signal is capable of being increased greatly by the multiple pin connection, it is possible to increase greatly the amount of transmittable information from the logic chip 200 to the DRAM 140, so that it becomes possible to secure a wide bus width. As a result, in addition to the effect of the first embodiment, it becomes possible to suppress delay of transmission of the electrical signal from the logic chip 200 to the DRAM 140, so that it is possible to operate the element in high speed operation.

As above, there has been described embodiment of the invention. However, of course, the present invention is not limited to the above described embodiments, and the person skilled in the art is capable of changing the above described embodiment within the scope of the present invention.

Figure 6:
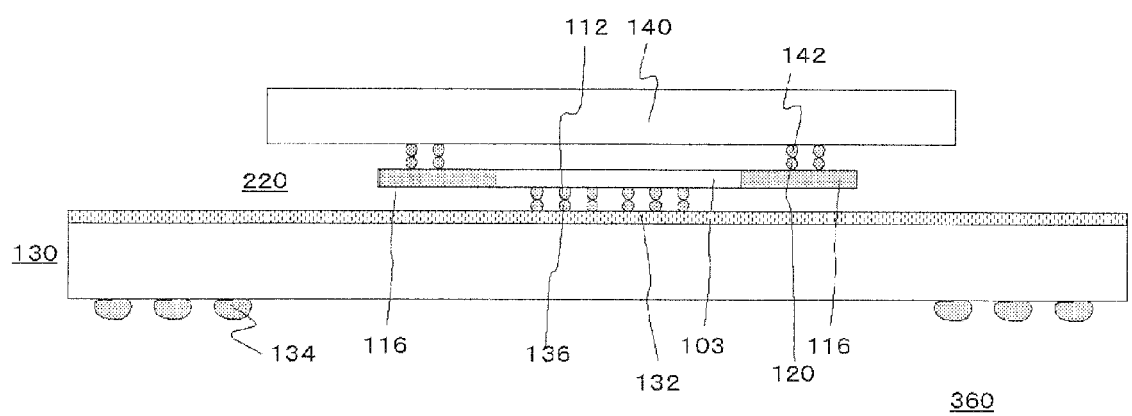
FIG. 6 is a cross-sectional view for explaining a structure of the semiconductor device according to the embodiment.

For instance, in the above embodiment, the configuration is that the logic chip 200 in which the logic circuit 116 is provided at center portion of the logic chip, and the converter circuit 103 is provided at periphery of the logic chip is used; however, as the semiconductor package 360 shown in FIG. 6, the logic chip 220 in which the converter circuit 103 is provided at center portion of the logic chip and the logic circuit 116 is provided at periphery of the logic chip may be used.

Figure 7:
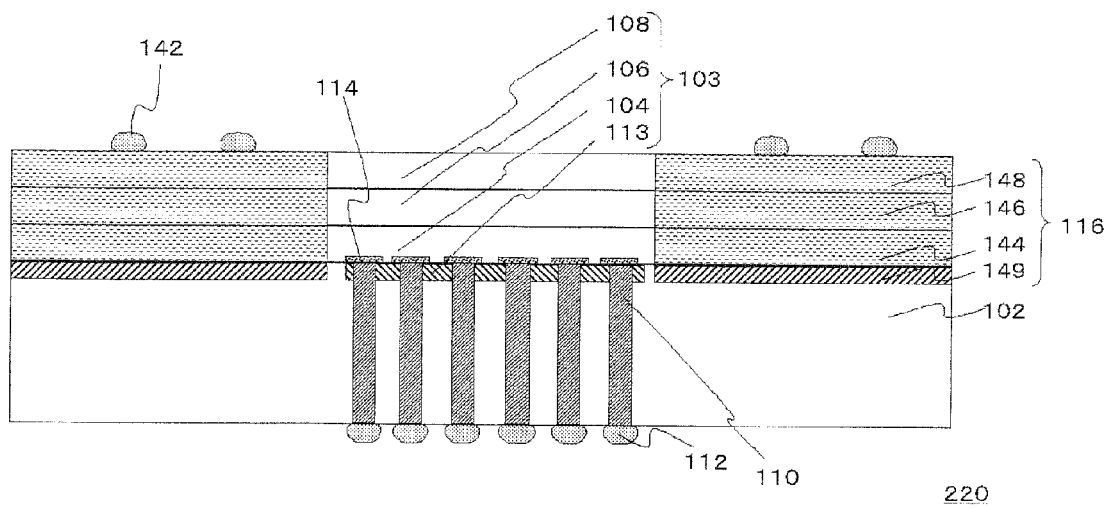
FIG. 7 is a cross-sectional view for explaining a structure of the semiconductor device according to the embodiment.

A detailed configuration of the logic chip 220 is shown in FIG. 7. The logic chip 220 is composed of the substrate 102, the through electrode 110, the logic circuit 116 and the converter circuit 103. In addition, the logic circuit 116 is composed of the element layer for logic circuit 149 constituted in such a way that transistors or the like are formed on the front surface of the substrate 102, the first interconnect layer 144, the second interconnect layer 146 and the third interconnect layer 148 formed on the substrate 102. The converter circuit 103 is composed of the element layer for the converter circuit 113 constituted in such a way that transistors or the like are formed on the substrate 102, and the first interconnect layer 104, the second interconnect layer 106 and the third interconnect layer 108 formed on the substrate 102.

The through electrode 110 is electrically connected to the package substrate 130 via the bump 112 mounted on the rear surface of the substrate 102 and the bump 136 mounted on the front surface of the interconnect layer 132 of the package substrate 130. In addition, the through electrode 110, which penetrates the substrate 102, is electrically connected to the interconnect 114 provided within the first interconnect layer 104.

In addition, in the above embodiment, the configuration is that the through electrode is electrically connected to the interconnect 114 within the first interconnect layer 104 in the converter circuit 103 of the logic chip, however, it may be that the through electrode is electrically connected to the interconnect within respective interconnect layers.

In addition, in the above embodiment, the configuration in which the DRAM 140 is used as for the memory mounted on the logic chip 200 is described, however, it may be suitable that another memory such as the flash memory or the like is mounted on the logic chip 200 to utilize it.

Figure 8:
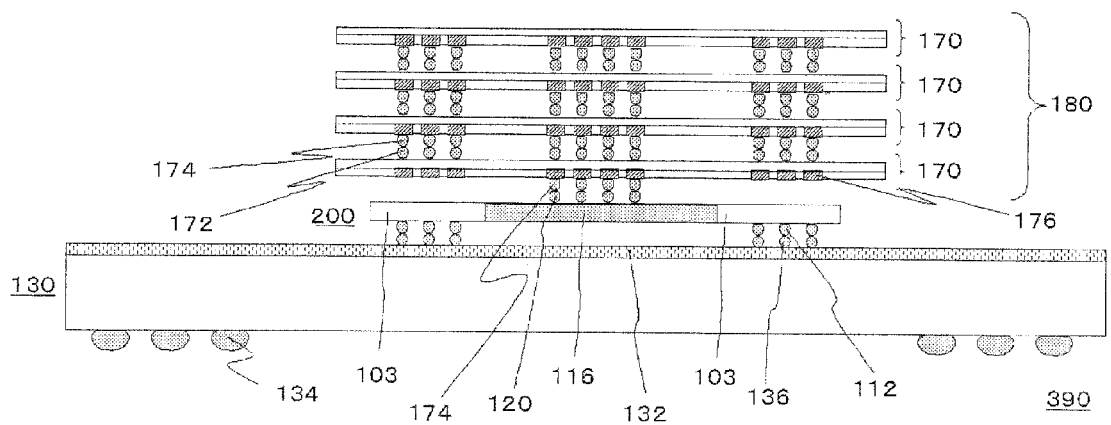
FIG. 8 is a cross-sectional view for explaining a structure of the semiconductor device according to the embodiment.

In addition, as a semiconductor package 390 shown in FIG. 8, a memory 180 with multi-level structure formed in such a way that a memory chip 170 with a through electrode 176 is stacked via a bump 172 mounted on the front surface of a memory chip 170 and a bump 174 mounted on the rear surface of the memory chip 170 may be used as a memory mounted on the logic chip 200.

In addition, a protection circuit or a protection element may be provided between the logic circuit 116 of the logic chip 200 and the bump 120.

In addition, in the above embodiment, the interconnect 114 electrically connected to the through electrode 110 is provided within the converter circuit 103, however, even if the interconnect is provided on another place, the interconnect may be electrically connected to the converter circuit 103.

In addition, in the above embodiment, there is described the configuration where the through electrode 110 is connected to the first interconnect layer 104 in the converter circuit 103, however, even if the through electrode 110 is connected to another circuit such as an interconnect layer provided within the logic circuit 116, the through electrode 110 may be connected to a lower layered interconnect layer.

Figure 9:
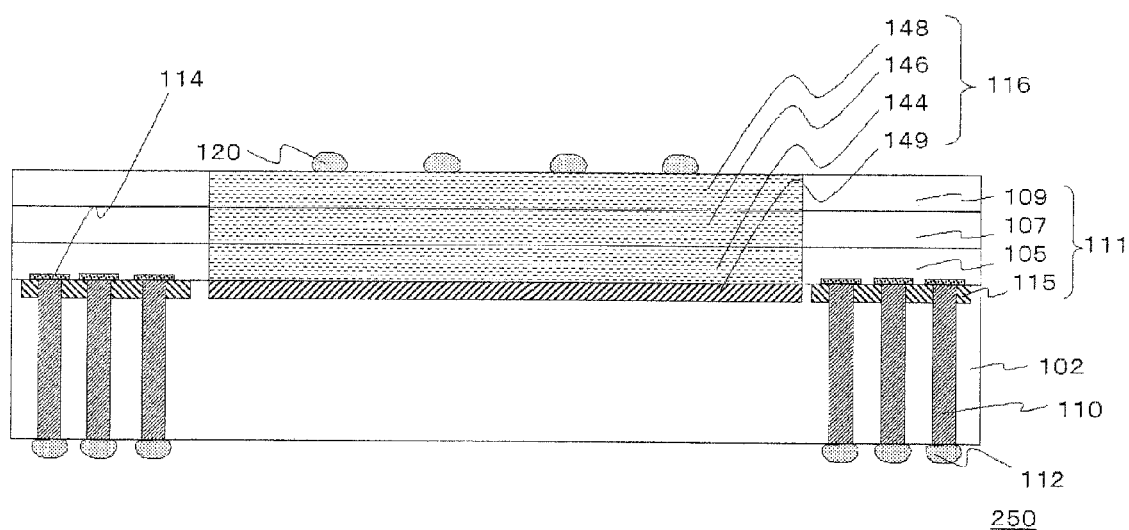
FIG. 9 is a cross-sectional view for explaining a structure of the semiconductor device according to the embodiment.
Figure 10:
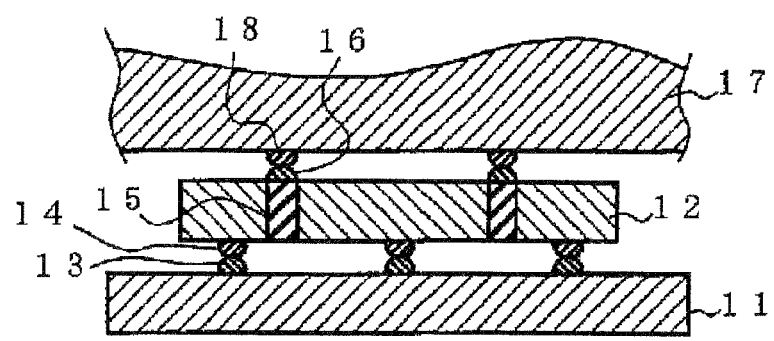
FIG. 10 is a cross-sectional view for explaining a structure of a conventional semiconductor device.

In addition, in the above embodiment, there is described the configuration where the converter circuit is provided in the logic chip, however, as a logic chip 250 shown in FIG. 9, an input/output buffer circuit 111 may be provided therein.

The logic chip 250 is composed of the substrate 102, the through electrode 110, the logic circuit 116 and the input/output buffer circuit 111. In addition, the logic circuit 116 is composed of the element layer for logic circuit 149 constituted in such a way that the transistors or the like are formed on the front surface of the substrate 102, and the first interconnect layer 144, the second interconnect layer 146 and the third interconnect layer 148 formed on the surface of the substrate 102. The input/output buffer circuit 111 is composed of an element layer for input/output buffer circuit 115 constituted in such a way that the transistors or the like are formed on the substrate 102, a first interconnect layer 105, a second interconnect layer 107 and a third interconnect layer 109 formed on the substrate 102. Here, as for an example of the input/output buffer circuit 111, for instance, the protection circuit or the like is indicated.

It is apparent that the present invention is not limited to the above embodiment, that may be modified and changed without departing from the scope and spirit of the invention.

The invention claimed is:

1. A semiconductor device comprising:
a first semiconductor chip with a first bump located on and extending beyond a main face of said first semiconductor chip; and
a second semiconductor chip having
i) a semiconductor substrate with a substrate front surface and a substrate rear surface,
ii) a circuit having a circuit element layer and formed on the front surface of said semiconductor substrate and multi-level circuit interconnect layers provided on the front surface of said semiconductor substrate and over said circuit element layer, wherein said circuit does not have a converter circuit,
iii) a converter circuit having converter circuit element layer formed on the front surface of said semiconductor substrate, and multi-level converter interconnect layers provided on the front surface of said semiconductor substrate and over said converter circuit element layer,
iv) a plurality of through electrodes penetrating said semiconductor substrate completely from the substrate front surface to the substrate rear surface, and
v) a second bump mounted on and extending beyond a top of said multi-level circuit interconnect layers, wherein
said first semiconductor chip and said second semiconductor chip are flip-chip connected with each other via said first bump and said second bump, and
the circuit element layer and the multi-level circuit interconnect layers occupy a first area of the substrate front surface, and the converter circuit element layer and the multi-level converter interconnect layers occupy a second area of the substrate front surface,
the second area being distinct from the first area and in vertical registration with the through electrodes, and
at least one layer of the converter circuit element layer and the multi-level converter interconnect layers is connected to a corresponding multi-level circuit interconnect layer, and at least one layer of the converter circuit element layer and the multi-level converter interconnect layers is connected to a corresponding through electrode.

2. A semiconductor device comprising:
a first semiconductor chip with a first bump located on and extending beyond a main face of said first semiconductor chip; and
a second semiconductor chip having
i) a semiconductor substrate with a substrate front surface and a substrate rear surface, ii) a circuit having a circuit element layer formed on the front surface of said semiconductor substrate and multi-level circuit interconnect layers provided on the front surface of said semiconductor substrate and over said circuit element layer, wherein said circuit does not have a buffer circuit, iii) a buffer circuit having a buffer circuit element layer formed on the front surface of said semiconductor substrate, and multi-level buffer interconnect layers provided on the front surface of said semiconductor substrate and over said buffer circuit element layer, and iv) a plurality of through electrodes penetrating said semiconductor substrate completely from the substrate front surface to the substrate rear surface; and v) a second bump mounted on and extending beyond a top of said multi-level circuit interconnect layers, wherein said first semiconductor chip and said second semiconductor chip are flip-chip connected with each other via said first bump and said second bump, and the circuit element layer and the multi-level circuit interconnect layers occupy a first area of the substrate front surface, and the buffer circuit element layer and the multi-level buffer interconnect layers occupy a second area of the substrate front surface, the second area being distinct from the first area and in vertical registration with the through electrodes, and at least one layer of the buffer circuit element layer and the multi-level buffer interconnect layers is connected to a corresponding multi-level circuit interconnect layer, and at least one layer of the buffer circuit element layer and the multi-level buffer interconnect layers is connected to a corresponding through electrode.

* * * * *